(12) United States Patent
Kim et al.

(10) Patent No.: US 12,040,208 B2
(45) Date of Patent: Jul. 16, 2024

(54) GUIDE APPARATUS FOR TRANSFERRING LIGHT-EMITTING DEVICES ONTO A SUBSTRATE AND METHOD APPLYING THE SAME

(71) Applicant: SAMSUNG ELECTRONICS CO., LTD., Suwon-si (KR)

(72) Inventors: Myunghee Kim, Suwon-si (KR); Seungran Park, Suwon-si (KR); Youngki Jung, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 17/540,859

(22) Filed: Dec. 2, 2021

(65) Prior Publication Data

US 2022/0384231 A1    Dec. 1, 2022

Related U.S. Application Data

(63) Continuation of application No. PCT/KR2021/013934, filed on Oct. 8, 2021.

(30) Foreign Application Priority Data

May 27, 2021    (KR) .......................... 10-2021-0068043

(51) Int. Cl.
*H01L 21/68*    (2006.01)
*H01L 23/00*    (2006.01)
*H01L 25/16*    (2023.01)

(52) U.S. Cl.
CPC .............. *H01L 21/68* (2013.01); *H01L 24/95* (2013.01); *H01L 25/167* (2013.01); *H01L 24/80* (2013.01);

(Continued)

(58) Field of Classification Search
CPC .............. H01L 21/67144; H01L 21/68; H01L 2224/80085; H01L 2224/80136;
(Continued)

(56) References Cited

U.S. PATENT DOCUMENTS 9,051,637 B2    6/2015    Lee
9,825,202 B2    11/2017    Schuele et al.
(Continued)

FOREIGN PATENT DOCUMENTS

CN    110112090 A    8/2019
JP    2005-268705 A    9/2005
(Continued)

OTHER PUBLICATIONS

Communication issued Nov. 10, 2022 by the European Patent Office in European Patent Application No. 21787290.2.
(Continued)

*Primary Examiner* — Minh N Trinh
(74) *Attorney, Agent, or Firm* — Sughrue Mion, PLLC

(57) ABSTRACT

A guide apparatus configured to transfer light-emitting devices in a liquid onto a substrate is provided. The guide apparatus includes a base configured to support the substrate; and a guide member configured to couple with the base to be seated on a mounting surface of the substrate in a state in which the substrate is supported on a surface of the base, wherein the guide member includes guide holes configured to respectively guide the light-emitting devices in the liquid to be disposed on the mounting surface of the substrate.

13 Claims, 23 Drawing Sheets

(52) U.S. Cl.
CPC .... *H01L 24/83* (2013.01); *H01L 2224/80085* (2013.01); *H01L 2224/80136* (2013.01); *H01L 2224/80203* (2013.01); *H01L 2224/80805* (2013.01); *H01L 2224/83085* (2013.01); *H01L 2224/83136* (2013.01); *H01L 2224/83201* (2013.01); *H01L 2224/95085* (2013.01); *H01L 2224/95101* (2013.01); *H01L 2224/95136* (2013.01); *H01L 2924/12041* (2013.01)

(58) Field of Classification Search
CPC . H01L 2224/80203; H01L 2224/80805; H01L 2224/83085
See application file for complete search history.

(56) References Cited

U.S. PATENT DOCUMENTS

| | | | |
|---|---|---|---|
| 9,917,226 | B1 | 3/2018 | Heine et al. |
| 10,109,658 | B2 | 10/2018 | Jeong et al. |
| 10,236,279 | B2 | 3/2019 | Ulmer et al. |
| 10,418,527 | B2 | 9/2019 | Sasaki et al. |
| 10,431,718 | B2 * | 10/2019 | Crowder .............. H01L 33/62 |
| 2013/0122197 | A1 | 5/2013 | Lee |
| 2017/0133550 | A1 | 5/2017 | Schuele et al. |
| 2017/0133558 | A1 | 5/2017 | Sasaki et al. |
| 2017/0133564 | A1 | 5/2017 | Ulmar et al. |
| 2017/0278835 | A1 | 11/2017 | Jeong et al. |
| 2018/0076352 | A1 | 3/2018 | Heine et al. |
| 2019/0181304 | A1 | 6/2019 | Sasaki et al. |
| 2019/0357395 | A1 | 11/2019 | Ahn et al. |
| 2022/0384231 | A1 * | 12/2022 | Kim .................. H01L 24/95 |

FOREIGN PATENT DOCUMENTS

| | | |
|---|---|---|
| JP | 2020-155428 A | 9/2020 |
| KR | 10-2013-0051888 A | 5/2013 |
| KR | 10-1619912 B1 | 5/2016 |
| KR | 10-2017-0110210 A | 10/2017 |
| KR | 10-2018-0030454 A | 3/2018 |
| KR | 10-2019-0009003 A | 1/2019 |
| KR | 10-2019-0131305 A | 11/2019 |
| KR | 10-2020-0004442 A | 1/2020 |
| KR | 10-2020-0053841 A | 5/2020 |
| WO | 2017/222960 A1 | 12/2017 |
| WO | 2018/222938 A1 | 12/2018 |
| WO | 2020107837 A1 | 6/2020 |

OTHER PUBLICATIONS

International Search Report and Written Opinion (PCT/ISA/237 and PCT/ISA/210), issued Feb. 24, 2022 by International Searching Authority in International Application No. PCT/KR2021/013934.

* cited by examiner

GUIDE APPARATUS FOR TRANSFERRING LIGHT-EMITTING DEVICES ONTO A SUBSTRATE AND METHOD APPLYING THE SAME

CROSS-REFERENCE TO RELATED APPLICATIONS

This application is a bypass continuation of International Application No. PCT/KR2021/013934, filed on Oct. 8, 2021, which is based on and claims priority to Korean Patent Application No. 10-2021-0068043, filed on May 27, 2021, in the Korean Intellectual Property Office, the disclosures of which are incorporated by reference herein in their entireties.

BACKGROUND

Field

The disclosure relates to a guide apparatus and a display transfer method using the same, and more particularly, to a guide apparatus which applies multiple light-emitting devices to a substrate when transferring through a fluidic self-assembly method and a display transfer method of producing a display module using the same.

Description of Related Art

When a nano scale light-emitting diode (LED) chip (e.g., LED chip of less than or equal to 100 μm) is transferred to a thin film transistor (TFT) substrate through a pick-and-place method, there has been problems of costs increasing according to reduced display performance and increased production time because wavelength uniformity with respect to a whole area of the substrate after transference is not sufficient.

Recently, nano scale LED chips are being transferred to substrates by using the fluidic self-assembly method to improve display yield and reduce production time.

SUMMARY

According to one or more embodiments, a guide apparatus capable of transferring a light-emitting device to a substrate without mounting grooves through a fluidic self-assembly method and a display transfer method using the same may be provided.

According to an aspect of the disclosure, there is provided a guide apparatus configured to transfer light-emitting devices in a liquid onto a substrate, the guide apparatus including: a base configured to support the substrate; and a guide member configured to couple with the base to be seated on a mounting surface of the substrate in a state in which the substrate is supported on a surface of the base, wherein the guide member includes guide holes configured to respectively guide the light-emitting devices in the liquid to be disposed on the mounting surface of the substrate when the guide apparatus, holding said substrate, is immersed into a dispersion of the light-emitting devices in the liquid.

A portion of the guide holes may have a first size, and a remaining portion of the guide holes may have a second size that is different from the first size.

Each of the guide holes may have a same size.

First guide holes of the guide holes provided in a first area of the guide member may have a first size, and second guide holes of the guide holes provided in a second area of the guide member may have a second size that is different from the first size.

Each of the guide holes may have a same shape.

First guide holes of the guide holes provided in a first area of the guide member may have a first shape, and second guide holes of the guide holes provided in a second area of the guide member may have a second shape that is different from the first shape.

The guide member may include a first substrate insertion groove configured to receive a first substrate and a second substrate insertion groove configured to receive a second substrate, and the first substrate insertion groove and the second substrate insertion groove are provided on an inside surface of the guide member.

A thickness of the guide member may be less than or equal to a thickness of each of the light-emitting devices.

The guide member may include a material which is removable by dissolution in a solvent.

The guide apparatus may further include a clamping member coupling the guide member to the base.

The base may include fixing members configured to fix the substrate to the base.

The fixing members may be configured to support respective corners of the substrate and are provided at positions corresponding to the respective corners of the substrate.

According to an aspect of the disclosure, there is provided a method of transferring light-emitting devices onto a substrate, the method including: coupling the substrate to a guide apparatus; loading the substrate and the guide apparatus that are coupled together into a liquid; introducing the light-emitting devices into the liquid in which the substrate and the guide apparatus are loaded; disposing the light-emitting devices onto the substrate through respective guide holes provided in the guide apparatus; performing a pre-bonding to fix the light-emitting devices to the substrate; and separating the substrate from the guide apparatus.

The introducing the light-emitting devices into the liquid and the disposing the light-emitting devices onto the substrate may be repeated at least two times, wherein respective times of the at least two times of the introducing the light-emitting devices into the liquid include introducing light-emitting devices of different sizes from one another into the liquid, and a size of a first light-emitting device introduced into the liquid at a first time is greater than a size of a second light-emitting device introduced into the liquid at a second time after the first time.

According to an aspect of the disclosure, there is provided a method of transferring light-emitting devices onto a substrate, the method including: applying an adhesive to the substrate; coupling the substrate to a guide apparatus; loading the substrate and the guide apparatus that are coupled together into a liquid; introducing the light-emitting devices into the liquid; disposing the light-emitting devices onto the substrate through guide holes provided in the guide apparatus; performing pre-bonding to fix the light-emitting devices to the substrate using the adhesive by pressing the light-emitting devices; and chemically removing the substrate from the guide apparatus.

According to an aspect of the disclosure, there is provided a method of assembling an inorganic light-emitting device (LED) display, including: positioning a substrate on a base; positioning a guide member on a top surface of the substrate, the guide member including a plurality of guide holes; transferring a plurality of inorganic LEDs onto the top surface of the substrate through the plurality of guide holes; and chemically removing the guide member and the base from the substrate to form the inorganic LED display, wherein an entirety of the top surface of the substrate is flat without any holes or grooves therein.

The transferring the plurality of inorganic LEDs may include loading the substrate, the base, and the guide member in a liquid including the plurality of inorganic LEDs.

The positioning the substrate on the base may include aligning the substrate with a plurality of fixing members positioned on the base.

The method may further include pressing the plurality of inorganic LEDs against the substrate to perform pre-bonding of the plurality of inorganic LEDs with the substrate.

The plurality of guide holes may have at least two different sizes or at least two different shapes.

According to one or more embodiments of the disclosure, production costs may be reduced because a separate process for forming the mounting groove on the substrate may be omitted, and the substrate being damaged may be fundamentally prevented in the process of forming the mounting groove.

In addition, according to one or more embodiments, production efficiency may be improved because a large area transfer is possible by using a generic-purpose substrate without mounting grooves.

DETAILED DESCRIPTION

Figure 1:
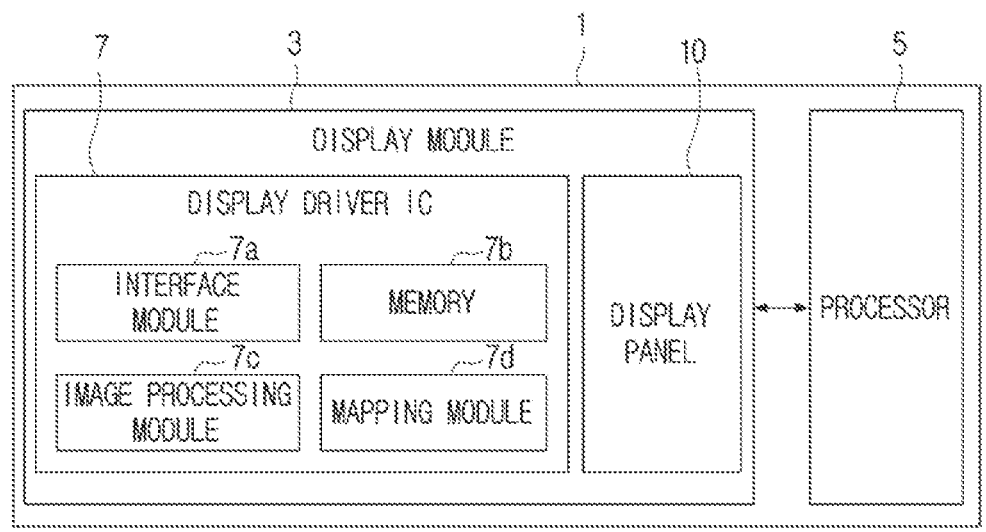
FIG. 1 is a block diagram illustrating an electronic apparatus including a display module according to various embodiments.

Terms used herein will be briefly described, and the disclosure will be described in detail. In describing the disclosure, detailed descriptions on related known technologies may be omitted, and redundant descriptions of the same configurations will be omitted.

The terms used in describing the various example embodiments of the disclosure are general terms selected that are currently widely used considering their function herein. However, the terms may change depending on intention, legal or technical interpretation, emergence of new technologies, and the like of those skilled in the related art. Further, in certain cases, there may be terms arbitrarily selected, and in this case, the meaning of the term will be disclosed in greater detail in the corresponding description. Accordingly, the terms used herein are not to be understood simply as its designation but based on the meaning of the term and the overall context of the disclosure.

Various modifications may be made to embodiments of the disclosure, and there may be various types of example embodiments. Accordingly, specific example embodiments will be illustrated in drawings, and embodiments will be described in detail in the detailed description. However, it should be noted that embodiments are not for limiting the scope of the disclosure to a specific example embodiment, but they should be interpreted to include all modifications, equivalents or alternatives of embodiments included in the ideas and the technical scopes disclosed herein. Meanwhile, in case it is determined that in describing embodiments, detailed description of related known technologies may unnecessarily confuse the gist of the disclosure, the detailed description will be omitted.

Terms such as "first," "second," and "third" may be used in describing the various elements, but the elements are not to be limited by the terms. The terms may be used only to distinguish one element from another element. For example, a first element may be designated as a second element without exceeding the claimed scope, and likewise a second element may be designated as a first element.

A singular expression includes a plural expression, unless otherwise specified. It is to be understood that the terms such as "comprise" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

The terms "module" or "part" used in the example embodiments herein perform at least one function or operation, and may be implemented with hardware or software, or a combination of hardware and software. Further, a plurality of "modules" or a plurality of "parts", except for a "module" or a "part" which needs to be implemented by specific hardware, may be integrated to at least one module and implemented in at least one processor.

A display module may include a display panel. The display panel may be a flat panel display panel and may be arranged with a plurality of inorganic LEDs which are less than or equal to 100 micrometers in size, respectively. A micro LED display module may provide better contrast, response time, and energy efficiency compared to a liquid crystal display (LCD) panel which requires a backlight. The micro LED which is of an organic LED and an inorganic light-emitting device both show good energy efficiency, but the micro LED is brighter and better in light-emitting efficiency and lifespan than an organic LED (OLED). The micro LED may be a semiconductor chip capable of emitting light on its own when power is supplied. The micro LED may show a fast response rate, low power, and high brightness. Specifically, the micro LED shows a higher efficiency in converting electricity to photons compared to a liquid crystal display (LCD) or an organic light emitting diode (OLED) of the related art. That is, the micro LED shows a higher "brightness per watt" than the LCD or the OLED display of the related art. Accordingly, the micro LED may exhibit the same brightness with about half in energy compared to the LED (width, depth and height exceeding 100 μm, respectively) or the OLED of the related art. In addition to the above, the micro LED may accurately represent a wide range of colors as implementing high resolution, superior colors, contrast and brightness is possible, and implement a clear screen even in outdoors where sunlight is bright. Further, the micro LED may be guaranteed a long lifespan without deformity because it is strong against a burn in phenomenon and less heat is generated.

The micro LED may be configured so that an anode electrode terminal and a cathode electrode terminal are formed on a same first surface and may include a flip-chip structure which is formed on a second surface on which a light-emitting surface is formed positioned opposite to the first surface on which the electrode terminals are formed.

A glass substrate may be disposed with a thin film transistor (TFT) layer on which a TFT circuit is formed on the front surface of the glass substrate, and a driving circuit for driving the TFT circuit may be disposed on the back surface of the glass substrate. The TFT circuit may be configured to drive multiple pixels disposed on the TFT layer.

The front surface of the glass substrate may be divided into an active area and an inactive area. The active area may correspond to an area occupied by the TFT layer at the front surface of the glass substrate, and the inactive area may be an area excluding the area occupied by the TFT layer at the front surface of the glass substrate.

An edge area of the glass substrate may be an outer most area of the glass substrate. In addition, the edge area of the glass substrate may be the remaining area excluding the area at which the circuit of the glass substrate is formed. In addition, the edge area of the glass substrate may include a side surface of the glass substrate, a part of the front surface of the glass substrate which is adjacent to the side surface, and a part of the back surface of the glass substrate. The glass substrate may be formed as a quadrangle type. Specifically, the glass substrate may be formed as a rectangle type or a square type. The edge area of the glass substrate may include at least one side of the four sides of the glass substrate.

The display module may include a glass substrate to which multiple LEDs are mounted and on which a side surface wiring is formed. The display module as described above may be applied as a single unit installed in a wearable device, a portable device, a handheld device, and/or an electronic product or electronic part which requires various displays, and may be applied to a display apparatus such as, for example, and without limitation, a monitor for a personal computer (PC), a high resolution television (TV) and signage (or, digital signage), an electronic display, or the like through a plurality of assembly arrangements in a matrix type.

Example embodiments of the disclosure will be described in detail with reference to the accompanying drawings to aid in the understanding of those of ordinary skill in the art. However, the disclosure may be realized in various different forms and is not limited to the various example embodiments described herein. Further, in the drawings, parts not relevant to the description may be omitted, and like reference numerals may be used to indicate like elements throughout the disclosure.

Further, example embodiments of the disclosure will be described in detail below with reference to the accompanying drawings and the descriptions disclosed in accompanying drawings, but it is to be understood that the disclosure is not limited by the example embodiments.

The display apparatus according to various example embodiments will be described below with reference to the drawings.

FIG. 1 is a block diagram of a display module of an electronic apparatus according to various embodiments.

Referring to FIG. 1, the display apparatus according to an example embodiment may include a display module 3 and a processor 5.

The display module 3 according to an example embodiment may be configured to display various images. The images referred herein may include a still image and/or a moving image. The display module 3 may be configured to display various images such as, for example, and without limitation, broadcast content, multimedia content, and the like. In addition, the display module 3 may be configured to display a user interface (UI) and an icon.

The display module 3 may include a display panel 10, and a display driver IC (DDI) 7 to control the display panel 10.

The display driver IC 7 may include an interface module 7a, a memory 7b (e.g., buffer memory), an image processing module 7c, and/or a mapping module 7d. The display driver IC 7 may be configured to receive, for example, image information including image data or an image control signal corresponding to an instruction for controlling the image data from another element of the display apparatus 1 through the interface module 7a. For example, according to an example embodiment, the image information may be received from the processor 5 (e.g., main processor (e.g., application processor)) or an auxiliary processor (e.g., graphics processing device) which is operated independently from the function of the main processor).

The display driver IC 7 may be configured to communicate through a sensor module and the interface module 7a. In addition, the display driver IC 7 may be configured to store at least a portion of the received image information in the memory 7b, for example, in frame units. The image processing module 7c may be configured to perform pre-processing or post-processing (e.g., resolution, brightness, or size adjustment) on, for example, at least a portion of the image data based on at least a feature of the image data or a feature of the display panel 10. The mapping module 7d may be configured to generate a voltage value or a current value corresponding to the image data which is pre-processed or post-processed through the image processing module 7c. According to an example embodiment, the generation of the voltage value or the current value may be performed, for example, based at least partly on a feature of the pixels of the display panel 10 (e.g., arrangement of pixels (RGB stripe or pentile structure), or size of respective sub pixels). At least a portion of the pixels of the display panel 10 may be configured so that visual information (e.g., a text, an image or an icon) corresponding to the image data is displayed through the display panel 10 by being driven based at least partly on, for example, the voltage value or the current value.

The display driver IC 7 may be configured to transmit a driving signal (e.g., driver driving signal, gate driving signal, etc.) to the display based on image information received from the processor 5.

The display driver IC 7 may be configured to display an image based on an image signal received from the processor 5. In an example, the display driver IC 7 may be configured to generate a driving signal of the plurality of sub pixels based on the image signal received from the processor 5, and display an image by controlling the light-emission of multiple sub pixels based on the driving signal.

The display module 3 may further include a touch circuit. The touch circuit may include a touch sensor and a touch sensor IC for controlling the touch sensor. The touch sensor IC may be configured to control, for example, the touch sensor to detect a touch input or a hovering input on a designated position of the display panel 10. For example, the touch sensor IC may be configured to detect the touch input or the hovering input by measuring changes in signal (e.g., voltage, amount of light, resistance, or amount of electric charge) on the designated position of the display panel 10. The touch sensor IC may be configured to provide information (e.g., position, area, pressure, or time) on the detected touch input or the hovering input to the processor 13. According to an example embodiment, at least a part (e.g., touch sensor IC) of the touch circuit may be included as a part of the display driver IC 7 or the display panel 10, or as a part of another element (e.g., auxiliary processor) disposed outside of the display module 3.

The processor 5 may be implemented as a digital signal processor (DSP) configured to process digital image signals, a microprocessor, a graphics processing unit (GPU), an artificial intelligence (AI) processor, a neural processing unit (NPU), or a time controller (TCON). However, embodiments are not limited thereto, and may include, for example, and without limitation, one or more of a central processing unit (CPU), a micro controller unit (MCU), a micro processing unit (MPU), a controller, an application processor (AP), a communication processor (CP), an ARM processor, or the like, or may be defined by the corresponding term. In addition, the processor 5 may be implemented as a System on Chip (SoC) or large scale integration (LSI) embedded with a processing algorithm, and may be implemented in the form of an application specific integrated circuit (ASIC) or a field programmable gate array (FPGA).

The processor 5 may be configured to operate an operating system or an application program to control hardware or software elements connected to the processor 5, and perform various data processing and calculation. In addition, the processor 5 may be configured to load and process instructions or data received from at least one of the other elements in a volatile memory, and store various data in a non-volatile memory.

Figure 2:
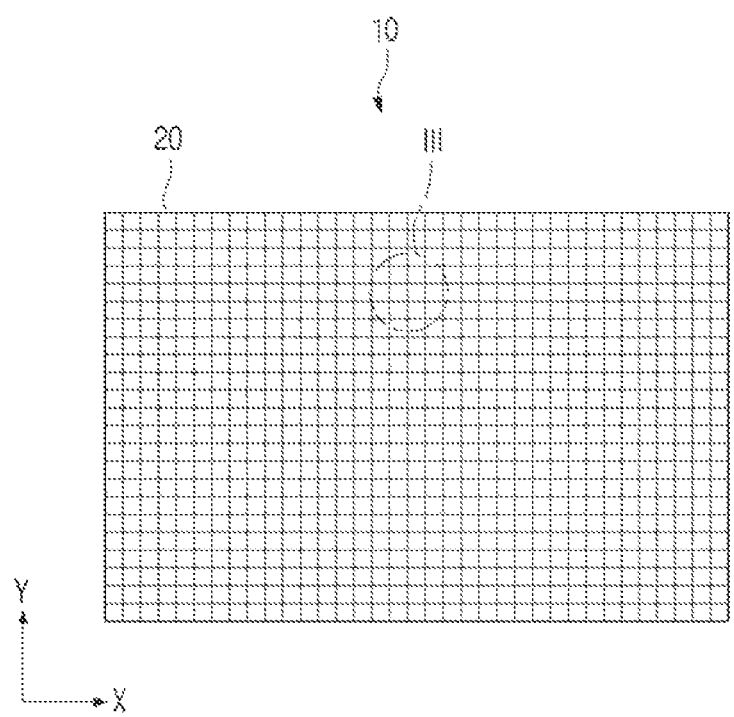
FIG. 2 is a view illustrating a display panel according to an embodiment.
Figure 3:
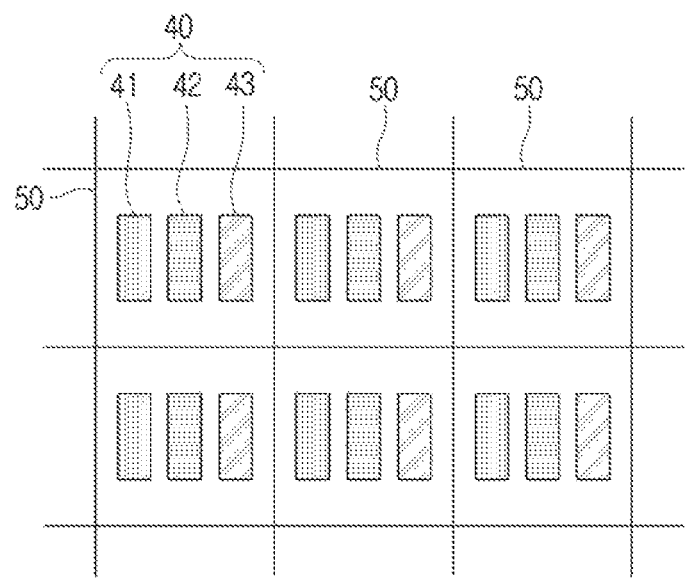
FIG. 3 is an enlarged view of part III indicated in FIG. 2, illustrating a pixel of a display panel.
Figure 4A:
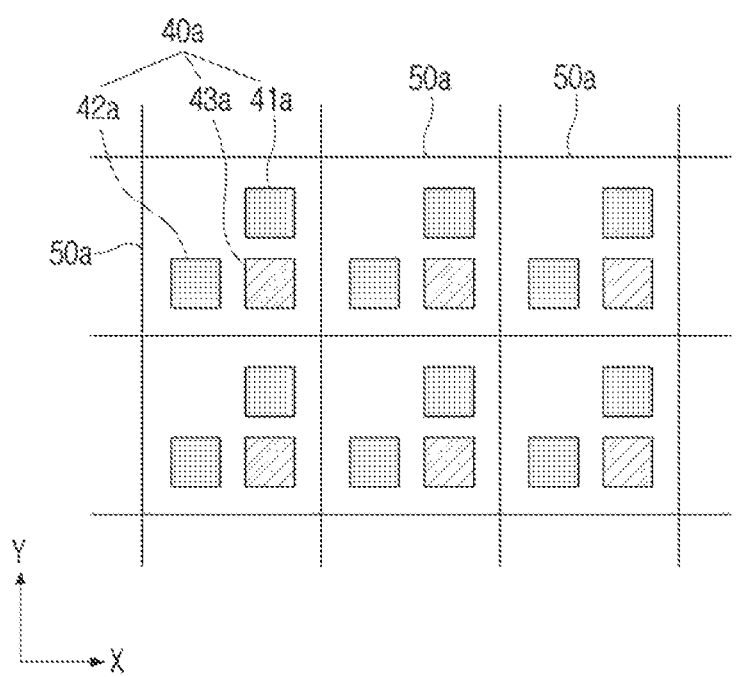
FIGS. 4A to 4C are views illustrating structures of a pixel of a display panel according to various embodiments.
Figure 4B:
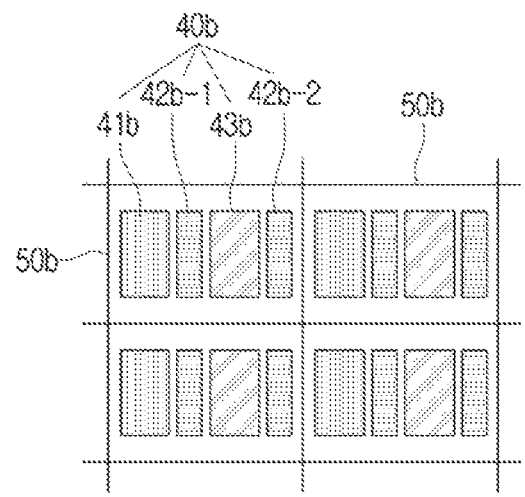
Figure 4C:
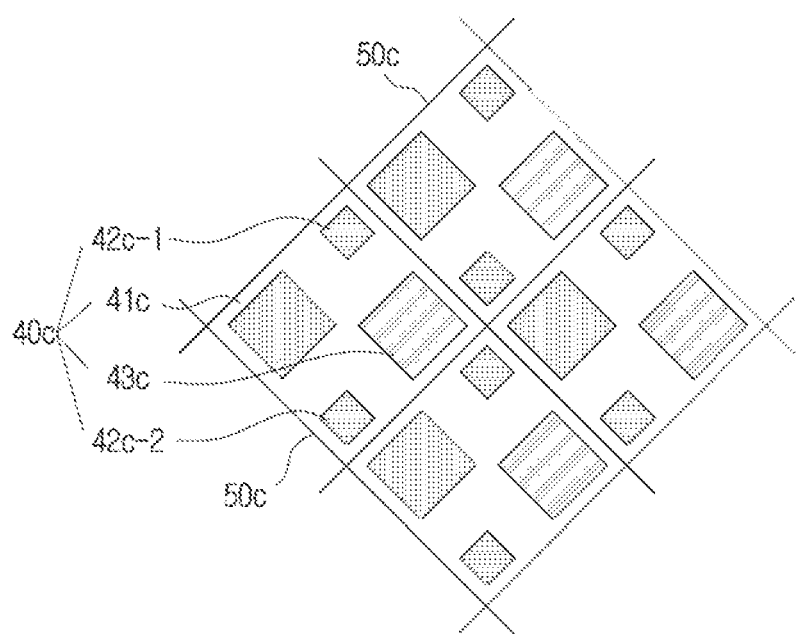

FIG. 2 is a view illustrating a display panel according to an example embodiment, FIG. 3 is an enlarged view of part III indicated in FIG. 2, illustrating a pixel of a display panel, and FIGS. 4A to 4C are views illustrating structures of a pixel of a display panel according to various example embodiments.

Referring to FIG. 2 and FIG. 3, the display panel 10 may include a plurality of pixels 40 arranged on the substrate 20.

The display panel 10 may include a plurality of pixel areas 50 which is disposed in matrix from. The respective pixel areas 50 may each include one pixel 40, and the one pixel 40 may include a first sub pixel 41 emitting a red (R) light, a second sub pixel 42 emitting a green (G) light, and a third sub pixel 43 emitting a blue (B) light.

The area not occupied by the first, second and third sub pixels 41, 42 and 43 in the one pixel area 50 may include a plurality of thin film transistors (TFTs) for driving the first to third sub pixels 41, 42 and 43.

The first to third sub pixels 41, 42 and 43 in the disclosure have been described as an example as being disposed in one line as in FIG. 3, but embodiments are not limited thereto. For example, the first, second and third sub pixels 41*a*, 42*a* and 43*a* which are included in one pixel 40*a* in the one pixel area 50*a* as in FIG. 4A may be disposed in various forms such as being disposed in an L form with the right and left sides reversed. Referring to FIG. 4B and FIG. 4C, the multiple pixels may be arranged in a pentile RGBG method. The pentile RGBG method may be a method which takes advantage of the fact that humans identify blue less and identify green the most to arrange a number of sub pixels of red, green and blue to a ratio of 1:1:2 (RGBG). The pentile RGBG method may be effective in that yield is increased, unit cost is lowered, and high resolution may be implemented on a small screen.

The pentile RGBG method may be, for example, such that one pixel 40*b* includes four sub pixels 41*b*, 42*b*-1, 42*b*-2 and 43*b* as in FIG. 4B. In this case, a red sub pixel 41*b* and a blue sub pixel 43*b* may be the same or nearly similar in size, and the first and second green sub pixels 42*b*-1 and 42*b*-2 may be formed to a size smaller than the red sub pixel 41*b* and the blue sub pixel 43*b*. The arrangement of the sub pixels within the one pixel 40*b* may be disposed, for example, in the order of the red sub pixel 41*b*, the first green sub pixel 42*b*-1, the blue sub pixel 43*b*, and the second green sub pixel 42*b*-2. The pentile RGBG method may be, for example, such that one pixel 40*c* includes four sub pixels 41*c*, 42*c*-1, 42*c*-2 and 43*c* as in FIG. 4C. The first and second green sub pixels 42*c*-1 and 42*c*-2 may be disposed between the red sub pixel 41*c* and the blue sub pixel 43*c* in a horizontal symmetry.

According to various example embodiments, the display module 3 may be a touch screen, a flexible display, a rollable display, and/or a 3D display coupled with a touch sensor. In addition, according to an example embodiment, multiple display modules of the disclosure may be provided and a large display may be realized by physically connecting the modules.

According to various example embodiments, the display panel 10 may include a substrate which may be implemented to forms such as an amorphous silicon (a-Si) TFT, a low temperature polycrystalline silicon (LTPS) TFT, a low temperature polycrystalline oxide (LTPO) TFT, a hybrid oxide and polycrystalline silicon (HOP) TFT, a liquid crystalline polymer (LCP) TFT, an organic TFT (OTFT), or the like.

Figure 5:
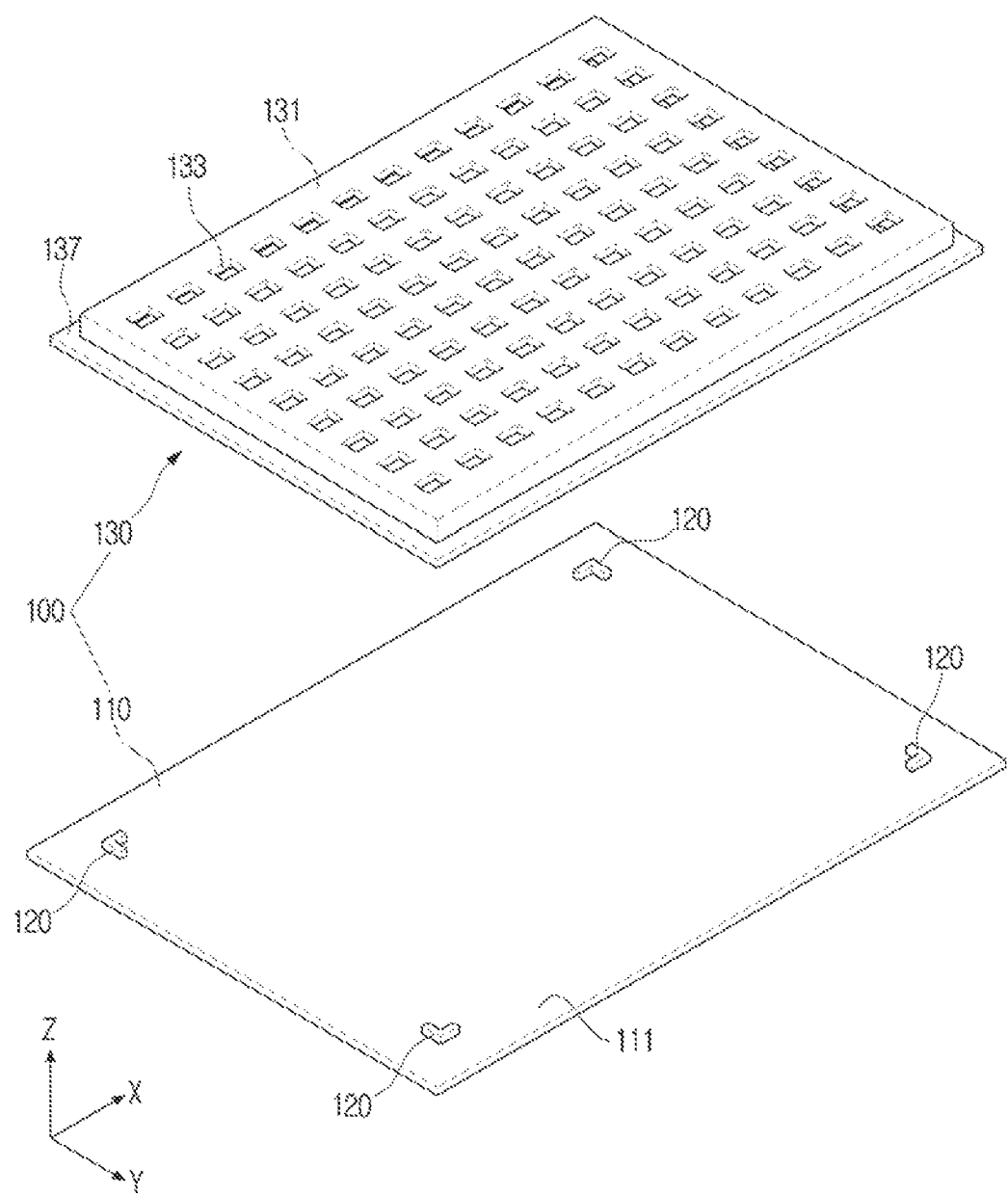
FIG. 5 is a perspective view illustrating a guide apparatus according to an embodiment.
Figure 6:
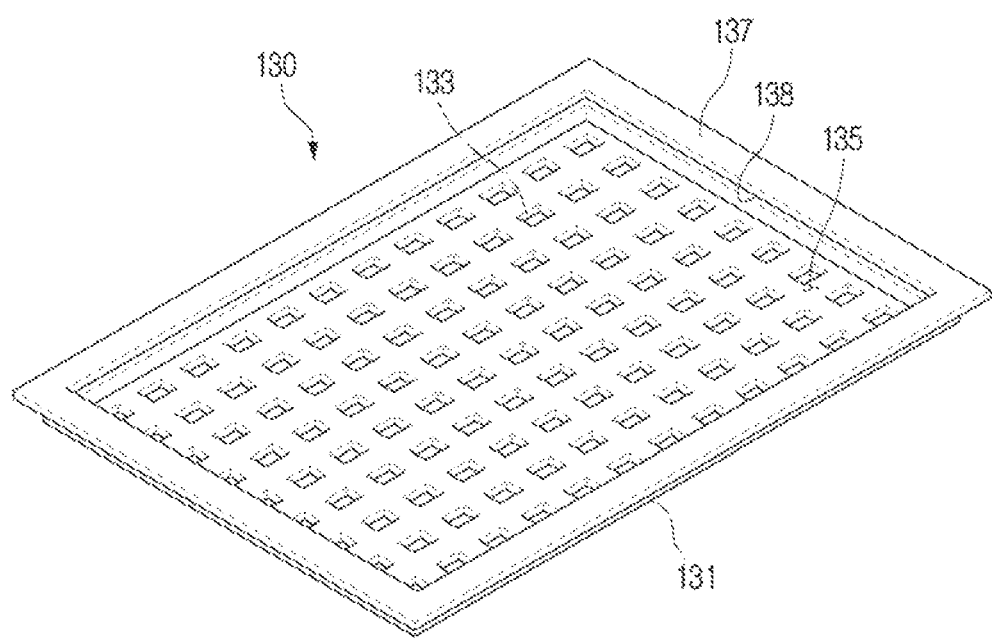
FIG. 6 is a perspective view illustrating a bottom part of the guide member illustrated in FIG. 5.
Figure 7:
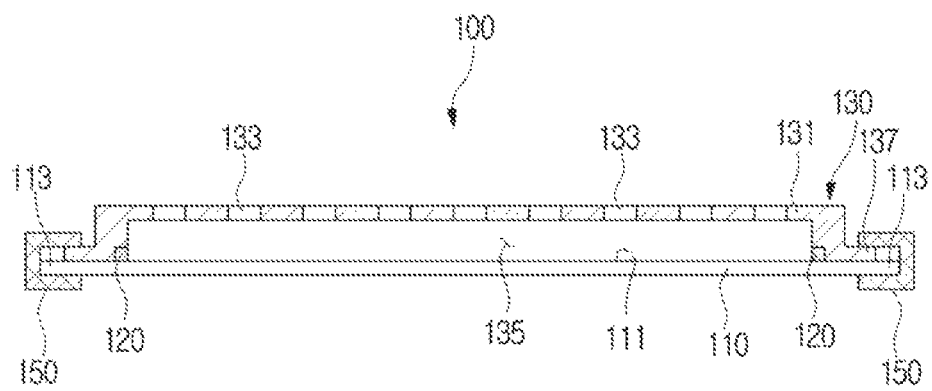
FIG. 7 is a cross-sectional view illustrating a guide apparatus according to an embodiment.

FIG. 5 is a perspective view illustrating a guide apparatus used when transferring the multiple light-emitting devices to the substrate of the display panel in the fluidic self-assembly method according to an example embodiment, FIG. 6 is a perspective view illustrating a bottom part of the guide member illustrated in FIG. 5, and FIG. 7 is a cross-sectional view illustrating a guide apparatus according to an example embodiment.

Referring to FIG. 5 to FIG. 7, a guide apparatus 100 according to an example embodiment may include a base 110 to which the substrate 20 is seated and a guide member 130 configured to cover a mounting surface 21 (referring to FIG. 10) of the substrate 20 seated on the base 110. The mounting surface 21 of the substrate 20 may be a surface to which the multiple light-emitting devices are electrically and physically connected. The mounting surface 21 may be provided, for example, with a pair of electrode terminals which is exposed to the outside of the respective pixel areas 50. The pair of electrode terminals may be an anode electrode terminal and a cathode electrode terminal. The mounting surface 21 may be formed with, for example, a light absorption layer (e.g., black matrix layer), and the light absorption layer may be configured to cover the entirety of the mounting surface 21 excluding the anode electrode terminal and the cathode electrode terminal.

The substrate 20 may not be formed with multiple mounting grooves to which multiple light-emitting devices are mounted to the mounting surface 21. That is, the mounting surface 21 may be planar surface without grooves. As described above, based on multiple mounting grooves not being formed on the mounting surface 21, the light-emitting device may be accurately transferred to a pre-set transfer position on the mounting surface 21 of the substrate through a guide member 130 according to the various example embodiments.

When applying the guide member 130 according to the various example embodiments to the fluidic self-assembly method, production costs of the substrate 20 may be prevented from rising because there is no need for patterning work such as an etch process to form multiple mounting grooves on the mounting surface 21 of the substrate 20. In addition, when forming mounting grooves on the mounting surface 21, an inner wall of the mounting groove may be formed at an incline and not formed vertically based on the feature of the etch process. Accordingly, the size of the mounting groove may be formed greater than the size of the light-emitting device. The size of the display panel 10 may increase as a result therefrom. However, when applying the guide apparatus 100 according to an example embodiment, there is no need to consider a size increase of the substrate because transferring of the light-emitting device on the substrate in the fluidic self-assembly method is possible even when the mounting groove is not formed on the substrate 20.

The substrate 20 is not be limited thereto and may be formed with the mounting groove to which the light-emitting device 140 is inserted on the mounting surface 21. Even when the mounting groove is formed on the mounting surface of the substrate as described above, the light-emitting device 140 may be transferred in the fluidic self-assembly method by applying the guide member 130 according to various example embodiments. In this case, even when a depth of the mounting groove is formed smaller than the thickness of the light-emitting device (e.g., depth of the mounting groove may be less than or equal to one-third (⅓) of the thickness of the light-emitting device), the light-emitting device may be accurately transferred to the pre-set transfer position in the mounting groove of the substrate 20 through the guide member 130 according to various example embodiments.

The base 110 may be formed in an approximate plate shape, and the surface on which the substrate 20 is seated may be flatly formed. The base 110 may be plate shaped having a predetermined thickness and may be comprised of a material having strength so as to not bend.

The base 110 may include multiple fixing members 120 for fixing the substrate 20 to the base 110.

The guide member 130 may be arranged with respect to the substrate 20 by the multiple fixing members 120. Multiple guide holes 133 provided in the guide member 130 may correspond to pre-set pixel areas on the substrate 20, respectively. The multiple fixing members 120 may be disposed at positions considering the arrangement of the substrate 20 and the guide member 130 as described above.

The multiple fixing members 120 may be configured such that four are provided to support four corners of the substrate 20 when the substrate 20 is formed as a quadrangle type or a rectangle type. The respective fixing members 120 may have a shape corresponding to the corner of the substrate 20. For example, the respective fixing members 120 may have an L shape which is folded at approximately a 90-degree angle.

The multiple fixing members 120 may be fixed to a predetermined position on the base 110 taking into consideration the size of the substrate 20 to be seated on a top surface 111 of the base 110. For example, two fixing members 120 may be disposed spaced apart at a distance corresponding to a length of one side of the substrate on the base 110 and the other two fixing members 120 may be disposed spaced apart at a distance corresponding to a length of the other side positioned opposite to the one side.

The base may be formed with multiple coupling grooves to be arranged in lattice form at a certain distance. In this case, the multiple fixing members 120 may be formed with coupling protrusions which are coupled to be separable in multiple coupling grooves, respectively. Accordingly, the multiple fixing members 120 may change positions on the base 110 according to the size of the substrate which is to be seated on the base 110.

An alignment mark which is marked on the respective top surfaces of the substrate 20 and the guide member 130 may be provided other than the multiple fixing members 120 as structures for aligning the guide member 130 with respect to the substrate 20. The alignment mark may be printed on the top surface of the substrate 20 and the guide member 130, or provided in a three-dimensional shape such as a groove or a protrusion. The alignment between the guide member 130 and the substrate 20 may be implemented in a method of detecting the respective positions by using a vision camera and then calculating a seating position of the guide member 130 on the top surface of the substrate 20 based therefrom.

The guide member 130 may be configured to guide the multiple light-emitting devices 140 to be transferred to the pre-set respective positions on the mounting surface 21 of the substrate when performing the fluidic self-assembly.

The guide member 130 may include a cover part 131 configured to cover the mounting surface 21 of the substrate 20 seated on the base 110, multiple guide holes 133 formed at the cover part 131, and a skirt part 137 extended along the surrounding of the cover part 131.

The guide member 130 may be comprised of a synthetic resin having elasticity. Because the guide member 130 may be provided in mass through injection molding, production costs may be lowered.

The cover part 131 may be configured such that when coupling with the base 110, an inside surface 135 facing the base 110 may contact the mounting surface 21 of the substrate 20. When the cover part 131 is configured to cover the mounting surface 21 of the substrate 20, the inside surface 135 of the cover part 131 may be configured to be in close contact with the mounting surface 21. The cover part 131 may be formed of not only synthetic resin, but also a metal material (e.g., an alloy material having strength, etc.).

The guide holes 133 adjacent to one another may be arranged to have a same pitch as a pitch (e.g., display pitch) of the light-emitting device which is to be transferred to the substrate 20. For example, the guide holes 133 arranged in a first direction (X direction indicated in FIG. 5) of the cover part 131 may correspond to a first pitch to which the light-emitting device set toward the first direction (a direction parallel to the X direction indicated in FIG. 5) of the substrate 20 is transferred. The guide holes 133 arranged in a second direction (Y direction indicated in FIG. 5) of the cover part 131 may correspond to a second pitch to which the light-emitting device set in the second direction (a direction parallel to the Y direction indicated in FIG. 5) of the substrate 20 is transferred.

The depth of the respective guide holes 133 may correspond to a thickness T1 (referring to FIG. 13) of the cover part 131. The thickness T1 of the cover part 131 may correspond to a thickness T2 (referring to FIG. 13) of the light-emitting device 140. Alternatively, the thickness T1 of the cover part 131 may be smaller than the thickness T2 of the light-emitting device 140. In this case, the thickness T1 of the cover part 131 may be a thickness to a degree that the light-emitting device 140 of the fluidic self-assembly is incapable of slipping out from the guide hole 133 after being inserted to the guide hole 133. It may be preferable for a size of the guide hole 133 to be formed slightly larger than a size of the light-emitting device 140 so that the light-emitting device 140 is not separated from the substrate 20 together with the guide member 130 while stuck in the guide hole 133 when the guide member 130 is separated from the substrate 20 after the fluidic self-assembly is completed.

A shape of the respective guide holes 133 may correspond to a shape of the light-emitting device 140. A size of the respective guide holes 133 may correspond to a size of the light-emitting device 140. In this case, the size of the respective guide holes 133 may be formed slightly larger than the size of the light-emitting device 140 to a degree that the light-emitting device 140 may be relatively easily inserted in the guide hole 133.

The skirt part 137 may be configured to contact with the top surface 111 of the base 110. The skirt part 137 may be configured to be in close contact with the top surface 111 of the base 110 when the cover part 131 is configured to cover the mounting surface 21 of the substrate 20. The skirt part 137 may be a part seated on the top surface 111 of the base 110 while covering the substrate 20 with the cover part 131. Accordingly, the guide member 130 may be stably disposed on the base 110.

A stepped part 138 as in FIG. 6 may be formed between the cover part 131 and the skirt part 137. The stepped part 138 may be configured such that, based on the guide member 130 being seated on the base 110, the skirt part 137 may be non-interfering by the multiple fixing members 120. In this case, because the multiple fixing members 120 are inserted and fitted in grooves which are formed by the stepped part 138, the guide member 130 may be aligned with respect to the substrate 20.

Referring to FIG. 7, the guide apparatus 100 according to an embodiment may include a clamping member 150 which couples the guide member 130 to the base 110 to be separable.

The clamping member 150 may be configured to stably fix the guide member 130 to the base 110 by grasping an edge part 113 of the base 110 with the skirt part 137 as in FIG. 7.

The clamping member 150 may not be limited to the structure illustrated in FIG. 7, and may be formed of various structures. For example, although not illustrated in the drawings, the clamping member 150 may be formed of a first member which grasps the base 110, a second member which grasps the skirt part 137, and a member which locks and unlocks the first and second members. Alternatively, the clamping member 150 may include the first and second members, and an elastic member elastically connecting the first and second members with each other.

An example of a process of transferring the multiple light-emitting devices 140 to the substrate 20 in the fluidic self-assembly method by applying the guide apparatus 100 according to an example embodiment will be described below.

Figure 8:
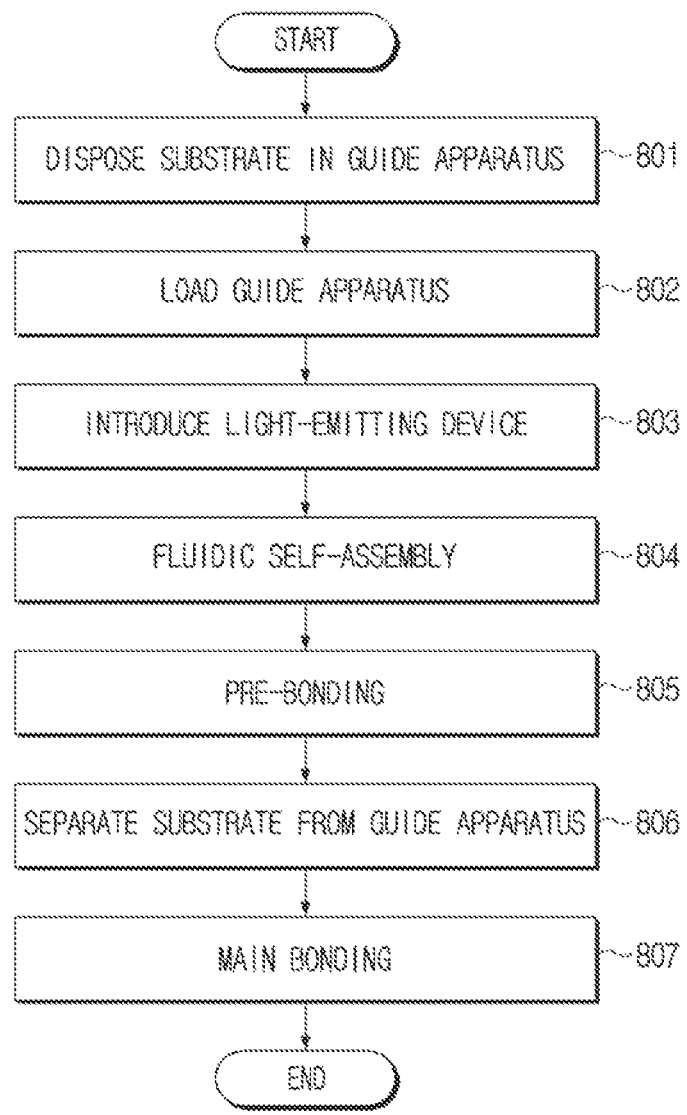
FIG. 8 is a flowchart illustrating a display transfer method according to an embodiment.

FIG. 8 is a flowchart illustrating a display transfer method according to an example embodiment, and FIGS. 9 to 14 are views illustrating a display transfer method according to an example embodiment.

First the substrate 20 may be disposed in the guide apparatus 100 (801 in FIG. 8).

Figure 9:
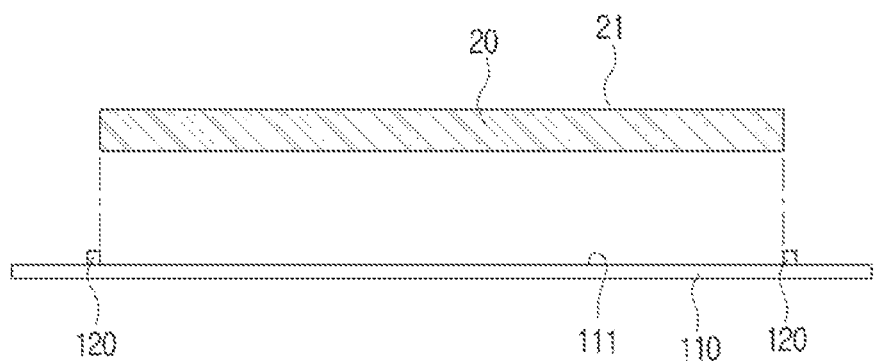
FIG. 9 is a view illustrating an example of seating a substrate to a base.

FIG. 9 is a view illustrating an example of seating a substrate to a base. For example, as in FIG. 9, the substrate 20 may be seated on the top surface 111 of the base 110. In this case, the substrate 20 may be disposed so that the mounting surface 21 is in an upward direction facing away from the base 110.

When the substrate 20 is seated on the base 110, the four corners of the substrate 20 may be stably disposed on the base 110 by the four fixing members 120.

Figure 10:
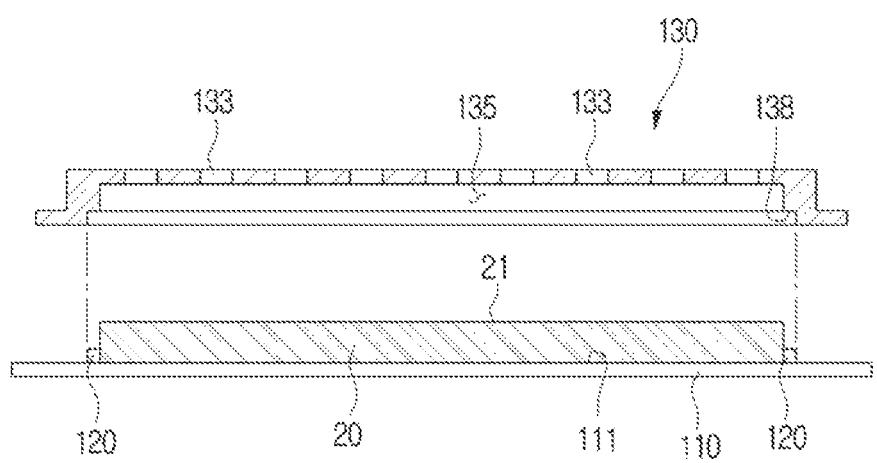
FIG. 10 is a view illustrating an example of covering a mounting surface of a substrate seated in a base with a guide member.

FIG. 10 is a view illustrating an example of covering the mounting surface 21 of the substrate 20 seated on the base 110 with the guide member 130.

Referring to FIG. 10, the guide member 130 may be configured to cover the mounting surface 21 of the substrate 20 after the substrate 20 is seated on the base 110. In this case, the multiple guide holes 133 provided in the guide member 130 may correspond to respective pixel areas 50 (referring to FIG. 3) provided on the mounting surface 21 of the substrate 20.

Figure 11:
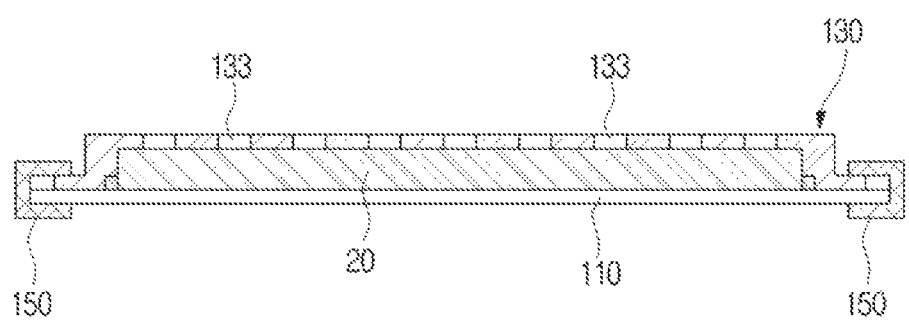
FIG. 11 is a view illustrating an example of coupling a base with a guide member through a clamping member.

FIG. 11 is a view illustrating an example of coupling the base 110 with the guide member 130 through the clamping member 150.

Referring to FIG. 11, while the guide member 130 is disposed on the base 110 to cover the mounting surface 21 of the substrate 20, multiple clamping members 150 may be used to fix the guide member 130 to the base 110 to prevent the substrate 20 from being separated from the guide apparatus 100 when performing fluidic self-assembly.

Prior to fixing the substrate 20 to the guide apparatus 100, a hydrophilic surface processing may be performed on the substrate 20 and the respective light-emitting devices 140, respectively. For example, the hydrophilic surface processing may be performed along column at which one substrate electrode pad (e.g., anode substrate electrode pad) of a pair of substrate electrode pads (anode substrate electrode pad and cathode substrate electrode pad) disposed at respective pixel areas of the substrate 20 is positioned. In addition, the hydrophilic surface processing may be performed on the one electrode terminal of the pair of electrode terminals (anode electrode terminal and cathode electrode terminal) of respective light-emitting devices 140. In this case, the electrode terminal for performing hydrophilic processing may be the same anode electrode terminal as with the hydrophilic processed substrate electrode pad of the substrate 20. The hydrophilic surface processing for modifying the substrate 20 and the respective light-emitting devices 140 to be hydrophilic may be applied with, for example, a chemical processing method, an ultraviolet irradiation method, an oxygen plasma processing method, or the like.

Figure 12:
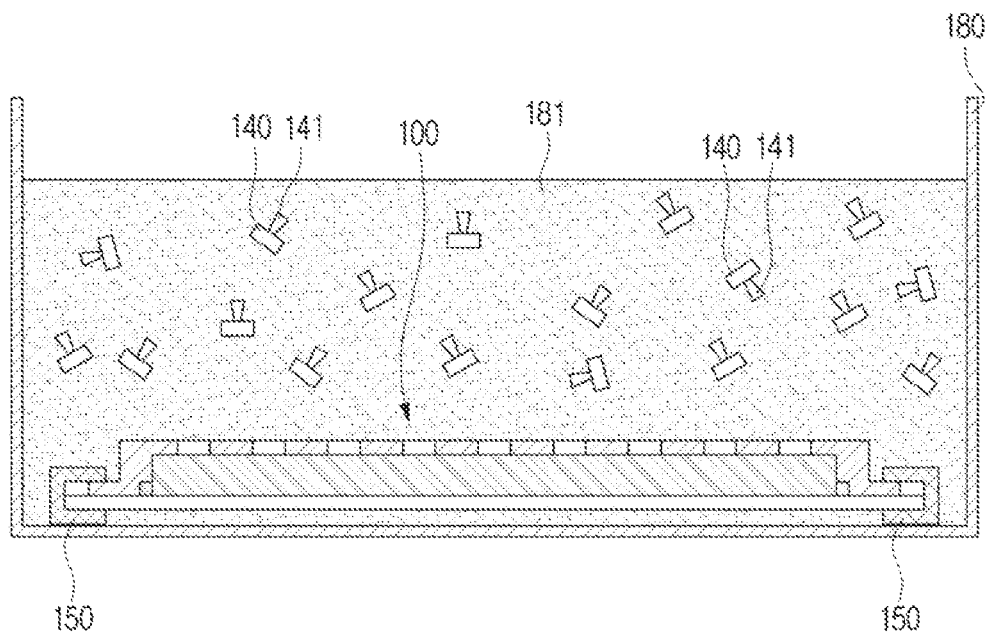
FIG. 12 is a view illustrating an example of loading a substrate disposed between a base and a guide member in a tank containing a liquid for a fluidic self-assembly.

FIG. 12 is a view illustrating an example of loading the substrate 20 disposed between the base 110 and the guide member 130 in the tank 180 containing the liquid 181 for the fluidic self-assembly.

Referring to FIG. 12, the guide apparatus 100 may be loaded in the tank 180 containing the liquid 181 (802 in FIG. 8), and the multiple light-emitting devices 140 may be introduced into the liquid 181 in the tank 180 (803 in FIG. 8).

Figure 13:
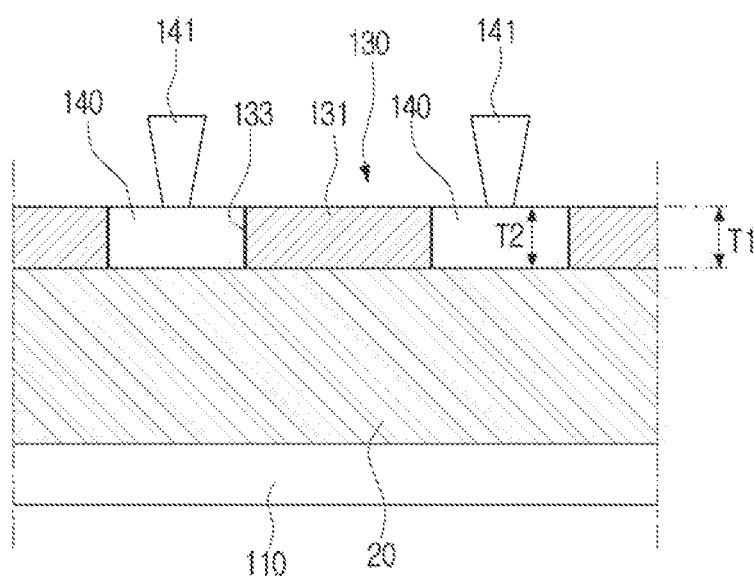
FIG. 13 is a view illustrating an example of transferring a light-emitting device to a substrate through a guide hole of a guide member.

FIG. 13 is a view illustrating an example of transferring the light-emitting device 140 to the substrate 20 through the guide hole 133 of the guide member 130.

When the liquid 181 in the tank 180 is circulated, the multiple light-emitting devices 140 dispersed in the liquid 181 may flow in the tank 180 and may be inserted into the respective guide holes 133 of the guide member 130 as in FIG. 13. In this case, the respective light-emitting devices 140 may be provided with a post 141 at one surface (e.g., a light-emitting surface of the light-emitting device 140). The post 141 may be configured to prevent the light-emitting device 140 from being inserted in reverse in the guide hole 133 when performing fluidic self-assembly.

The respective light-emitting devices 140 may be configured to attach to the hydrophilic surface processed part of the substrate 20 while being inserted into the guide hole 133. As described above, the multiple light-emitting devices 140 may be arranged at respective positions on the substrate 20 through the fluidic self-assembly (804 in FIG. 8).

Based on multiple light-emitting devices 140 being inserted to the whole of the multiple guide holes 133 of the guide member 130, the guide apparatus 100 may then be moved out from the tank 180.

A pre-bonding may be carried out prior to separating the guide member 130 from the substrate 20 (805 in FIG. 8). For example, the pre-bonding may include carrying out the thermocompression process of pressing the multiple light-emitting devices 140 with a pressing member with a predetermined pressure towards the substrate 20 side and bonding the multiple light-emitting devices 140 to the mounting surface 21 of the substrate 20. In this case, a pair of electrode terminals of the multiple light-emitting devices 140 may be bonded to a pair of substrate electrode pads arranged on the mounting surface 21 of the substrate 20 corresponding thereto. The bond between the respective terminals and the corresponding pads may be a bond of a degree of which the light-emitting device transferred to the substrate 20 does not separate from the substrate 20 with the guide member 130 when separating the guide member 130 from the substrate 20.

The guide member 130 may be formed of a synthetic resin or a metal material having heat resistance so that deformation does not occur while undergoing a thermocompression process.

The posts 141 provided to the respective light-emitting devices 140 may be removed prior to separating the guide member 130 from the substrate 20. As another example, the posts 141 may not be removed until after separating the guide member 130 from the substrate 20.

Figure 14:
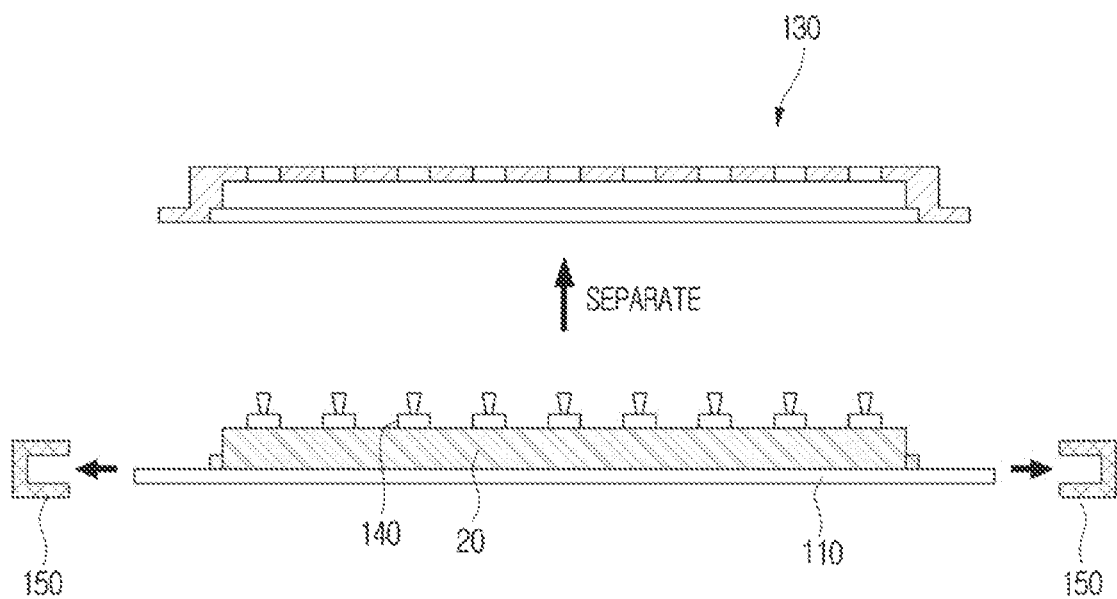
FIG. 14 is a view illustrating an example of separating a guide member from a substrate to which transference of a light-emitting device is completed.

FIG. 14 is a view illustrating an example of separating the guide member 130 from the substrate 20 to which transference of the light-emitting device 140 is completed.

Referring to FIG. 14, the guide member 130 may be separated from the substrate 20 (or base 110) after multiple clamping members 150 are separated from the base 110 and the guide member 130 (806 in FIG. 8).

After separating the guide member 130 from the substrate 20, the substrate 20 may be separated from the base 110.

Then, the multiple light-emitting devices 140 may be firmly bonded to the mounting surface 21 of the substrate 20 through a main bonding (807 in FIG. 8).

The main bonding may be carried out through the thermocompression process like the pre-bonding. In this case, the pair of electrode terminals of the light-emitting device 140 may be, for example, eutectic bonded to the pair of substrate electrode pads arranged on the mounting surface 21 of the substrate 20 corresponding thereto. Here, the eutectic bonding may refer to a metal which is heated changing directly to a liquid state at a lowest melting point without going through an intermediate state between a solid and a liquid when metals comprising an alloy which form the electrode terminal and the substrate electrode pad have a certain ratio.

According to an example embodiment as described above, when the guide apparatus 100 is used, the light-emitting device 140 may be transferred to the substrate 20 on which mounting grooves are not formed on the mounting surface 21 in the fluidic self-assembly method. Accordingly, production costs may be reduced because a separate process for forming the mounting groove on the substrate 20 may be omitted, and the substrate 20 may be fundamentally prevented from being damaged in the process of forming the mounting groove. In addition, because a large area transfer is possible by using a generic-purpose substrate without mounting grooves, production efficiency may be improved.

The guide apparatuses according to the various example embodiments will be described below with reference to FIGS. 15 to 19.

Figure 15:
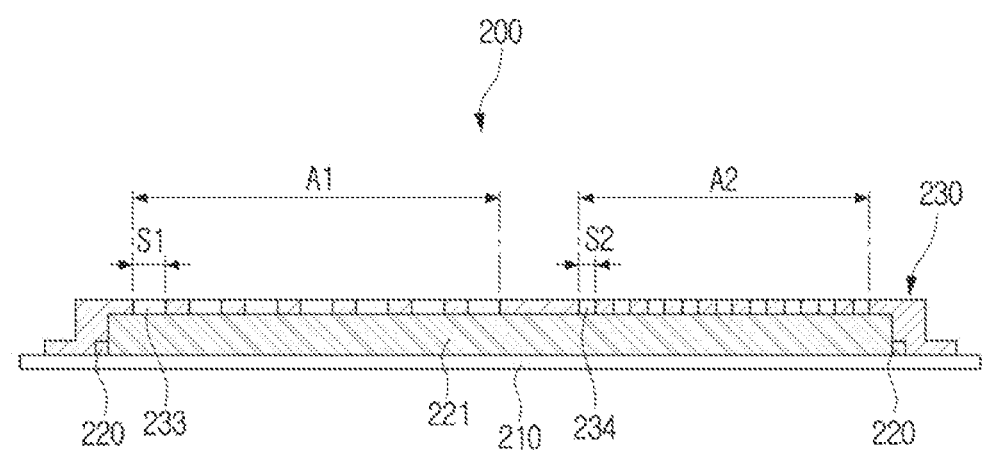
FIG. 15 is a cross-sectional view illustrating a guide member according to an embodiment.

Referring to FIG. 15, a guide apparatus 200 according to an example embodiment may include a base 210 on which a substrate 221 is seated, a guide member 230 separably coupled to the base 210, and multiple clamping members for locking and unlocking the guide member 230 on the base 210. The clamping members may be the clamping members 150 described above.

The base 210 may be configured such that multiple fixing members 220 fixing the substrate 221 on the top surface of the base 210 on which the substrate 221 is seated may be disposed. The base 210 may have the same or similar structure and shape as with the base 110 (referring to FIG. 7) described above.

The guide member 230 may be formed in plurality with multiple first guide holes 233 having a first size 51 in a first area A1. The guide member 230 may be formed with multiple second guide holes 234 having a second size S2 different from the first size S1 in a second area A2. For example, the first size S1 may be greater than the second size S2.

As described above, the guide member 230 may be configured such that the multiple guide holes 233 and 234 have different sizes from one another. In this case, light-emitting devices of different sizes for respective areas of the mounting surface may be transferred to the substrate 221.

For example, the guide member 230 may be formed with multiple guide holes having three or more sizes different from one another. In this case, the sizes of the guide holes formed in the same area may be the same, and may have different sizes from the guide holes formed at different areas.

Figure 16:
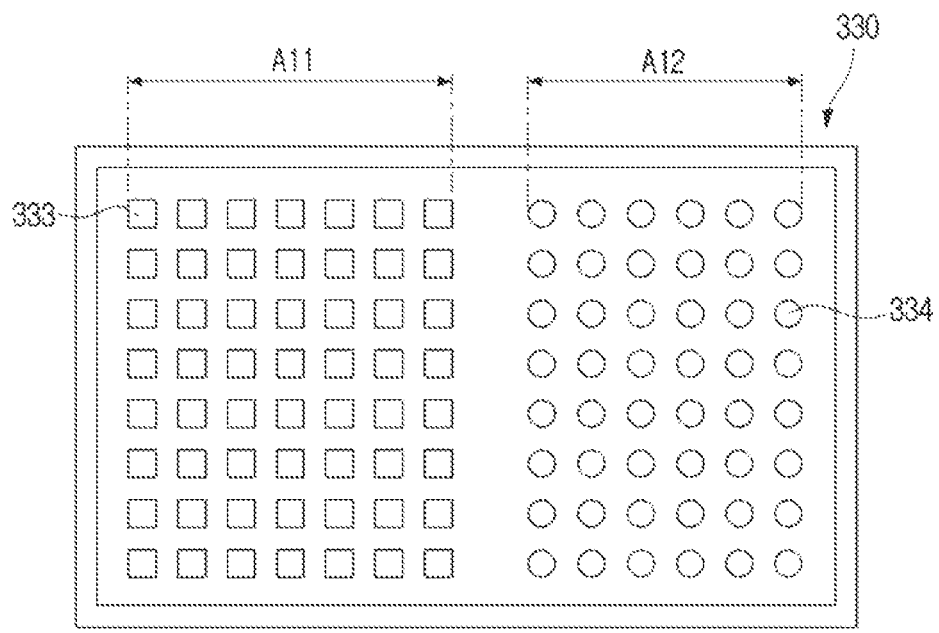
FIG. 16 is a bottom view illustrating a guide member according to an embodiment.

Referring to FIG. 16, a guide member 330 may be formed with multiple first guide holes 333 in one area A11, and formed with multiple second guide holes 334 in another area A12. The shape of the multiple first guide holes 333 and the shape of the multiple second guide holes 334 may be different from one another. For example, the shape of the multiple first guide holes 333 may be roughly a quadrangle type. The shape of the multiple second guide holes 334 may be roughly a circular type.

Although the shape of multiple first guide holes 333 has been described as an example of forming roughly a quadrangle type, the embodiment is not limited thereto, and may be formed to correspond to the shape of the light-emitting device which is to be mounted on the substrate. Likewise, the shape of the multiple second guide holes 334 has been described as an example of forming roughly a circular type, but the embodiment is not limited thereto, and may be formed to correspond to the shape of the light-emitting device which is to be mounted on the substrate. In this case, the shape of the multiple second guide holes 334 may differ from the shape of the multiple first guide holes 333.

Figure 17:
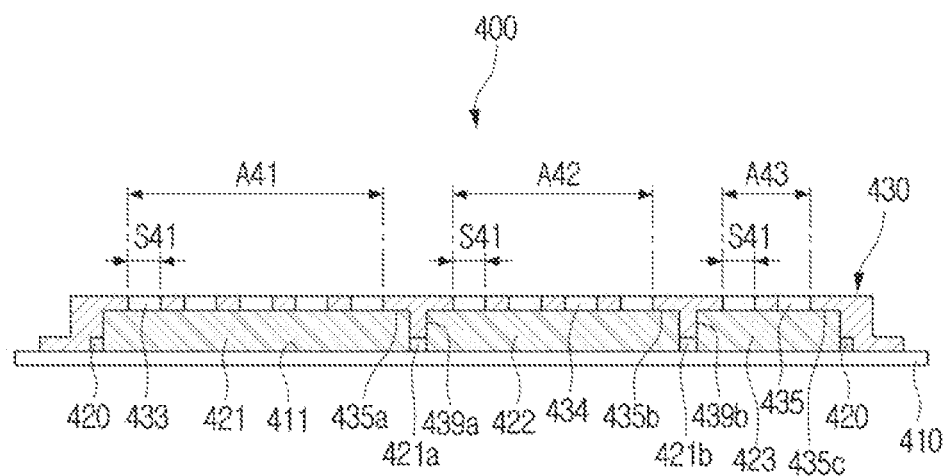
FIG. 17 is a cross-sectional view illustrating a guide member according to an embodiment.

Referring to FIG. 17, the guide apparatus 400 may be configured to receive multiple substrates, for example, a first substrate 421, a second substrate 422, and a third substrate 423 together. The first to third substrates 421, 422 and 423 may have sizes different from one another. For example, the size of the first substrate 421 may be the largest, and the size of the third substrate 423 may be the smallest.

The guide apparatus 400 may include a base 410, a guide member 430, and a clamping member.

Figure 18:
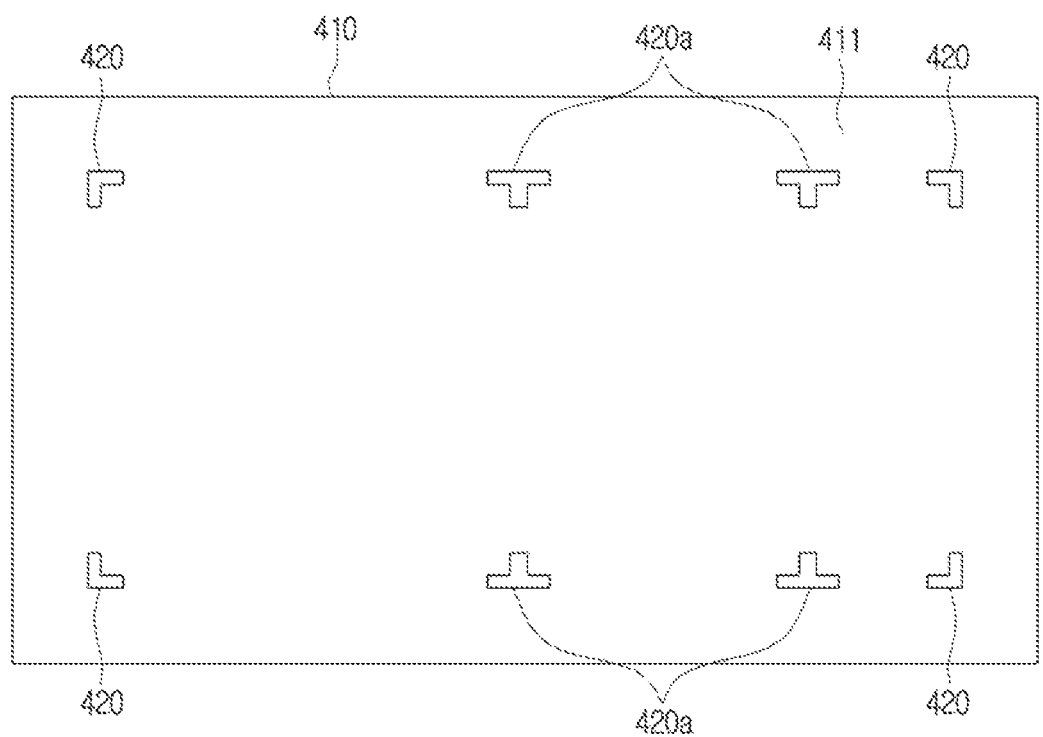
FIG. 18 is a cross-sectional view illustrating a guide member according to an embodiment.

Referring to FIG. 18, the base 410 may be disposed with multiple first fixing members 420 and multiple second fixing members 420*a* on the top surface 411. The multiple first fixing members 420 and the multiple second fixing members 420*a* may be disposed on the base 410 at different distances from one another according to the size of the substrate being fixed, respectively.

For example, the multiple first fixing members 420 may be formed roughly to an L shape, and the two corners at the left side of the first substrate 421 and the two corners at the right side of the third substrate 423 may be fixed.

For example, the multiple second fixing members 420*a* may be formed roughly to a T shape, and the two corners at the right side of the first substrate 421, the four corners of the second substrate 422, and the two corners at the left side of the third substrate 423 may be fixed.

Accordingly, the first to third substrates 421, 422 and 423 may be fixed to the base 410 by the multiple first and second fixing members 420 and 420*a*.

The guide member 430 may be formed with multiple partition walls 439*a* and 439*b* so that the portion with the respective mounting surfaces of the first to third substrates 421, 422 and 423 is fixed in the inside surface (surface facing the base 410). In this case, the multiple partition walls 439*a* and 439*b* may be formed integrally with the guide member 430. As described above, the guide member 430 may be provided with multiple substrate insertion grooves to which respective substrates are inserted by the multiple partition walls 439*a* and 439*b* in the inside surface.

The guide member 430 may be formed with multiple guide holes 433 at three areas A41, A42 and A43 corresponding to the first to third substrates 421, 422 and 423, respectively. In this case, the multiple guide holes 433 formed at the three areas A41, A42 and A43 may all have the same size S41.

According to an example embodiment, the guide member 430 may be configured such that the size of the guide holes formed in at least one area of the three areas A41, A42 and A43 differs from the size of the guide holes formed at the remaining two areas. In addition, the guide member 430 may be configured such that the shape of the guide holes formed in at least one area of the three areas A41, A42 and A43 differs from the shape of the guide holes formed at the remaining two areas.

Figure 19:
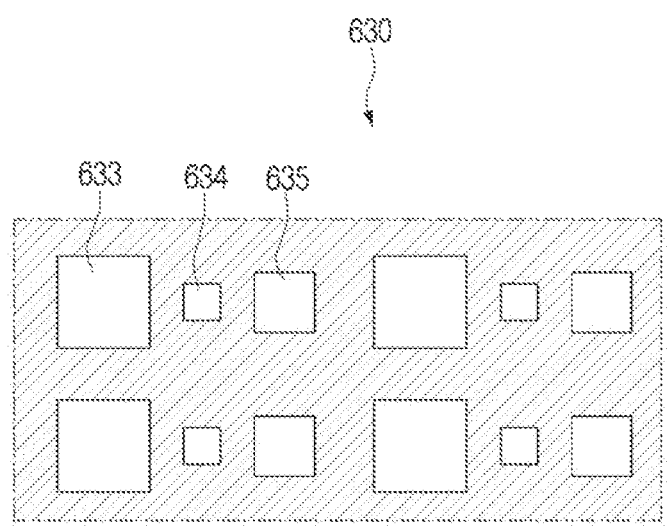
FIG. 19 is a partially enlarged view illustrating a guide member according to an embodiment.

Referring to FIG. 19, a guide member 630 may be formed with multiple guide holes corresponding to one pixel area of the substrate. Based on red, green, and blue light-emitting devices being arranged in the one pixel area, three guide holes 633, 634 and 635 may be formed.

The three guide holes 633, 634 and 635 corresponding to the one pixel area may be repeatedly formed at a certain distance from each other (e.g., a distance corresponding to a display pitch disposed on the substrate) on the guide member 630.

The three guide holes 633, 634 and 635 may differ in size with one another. For example, a first guide hole 633 may have a first size and a second guide hole 634 may have a second size smaller than the first size. This takes into consideration that the light-emitting efficiency may differ according to the color of light the light-emitting device emits, and for example, the guide hole 633 for guiding the red light-emitting device to the substrate may have the largest size and the guide hole 634 for guiding the green light-emitting device to the substrate may have the smallest size. The remaining guide hole 635 may be configured to guide the blue light-emitting device.

When light-emitting devices of different sizes from one another (e.g., a first light-emitting device having a first size and a second light-emitting device having a second size smaller than the first size) are transferred to the substrate in the fluidic self-assembly method, the light-emitting device of the largest size may be transferred to the substrate through the guide hole 633 of the guide member. Based on the method as described above, the light-emitting devices may be transferred to the substrate through the guide member 630 from the largest to the smallest in size in sequential order.

Figure 20:
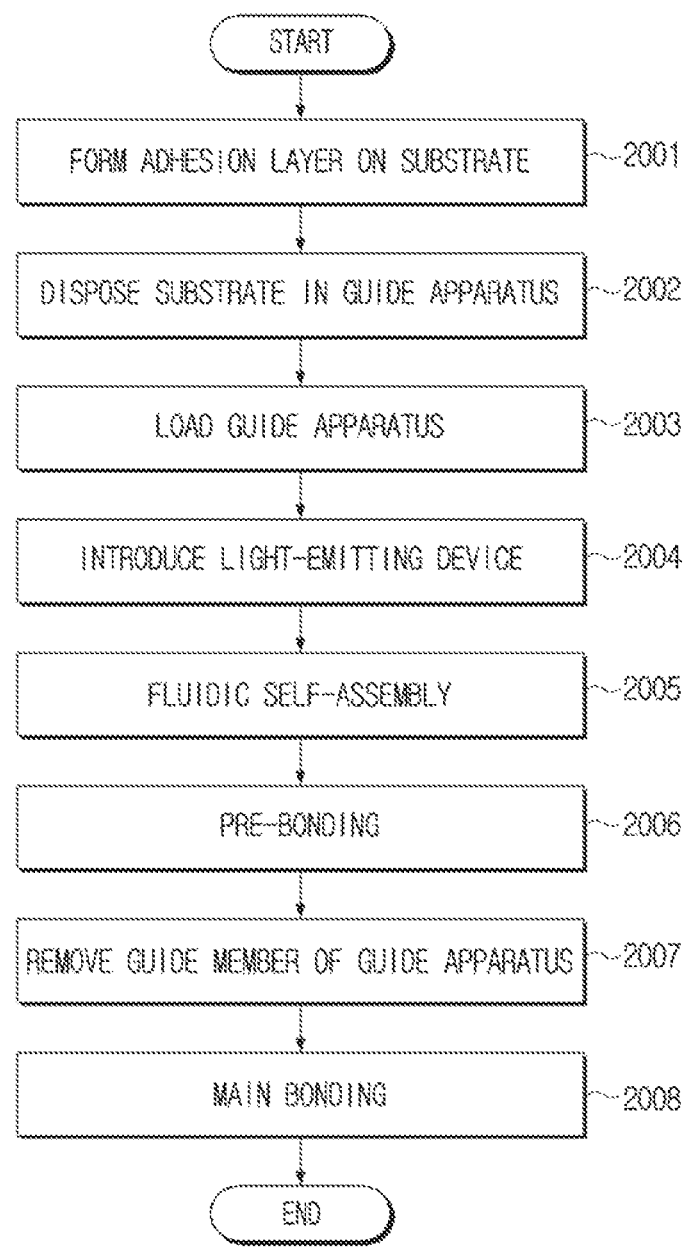
FIG. 20 is a flowchart illustrating a display transfer method according to an embodiment.
Figure 21:
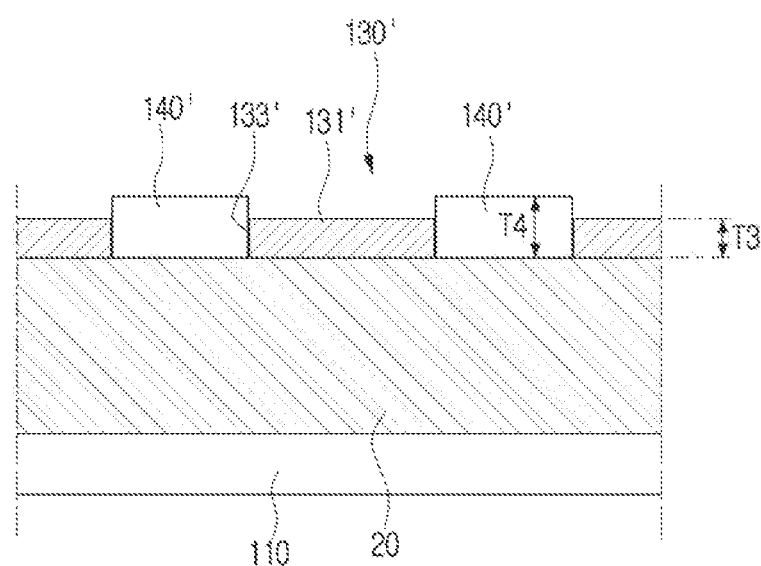
FIG. 21 is a cross-sectional view illustrating an example of a thickness of a guide member being less than a thickness of a light-emitting device.

FIG. 20 is a flowchart illustrating a display transfer method according to an example embodiment, and FIG. 21 is a cross-sectional view illustrating an example of a thickness of a guide member being less than a thickness of a light-emitting device.

The display transfer method according to an example embodiment may include using a guide member 130' (referring to FIG. 21) and removing the guide member 130' in a chemical method after transferring multiple light-emitting devices 140' to the substrate 20 in the fluidic self-assembly method. In this case, the guide member 130' may be formed of a material that can be dissolved by a solvent that does not dissolve the various components formed in the display and the base 110. For example, when the guide member 130' is made of resin, the solvent may have a component capable of dissolving the resin.

Referring to FIG. 20, an adhesive may be applied to the mounting surface of the substrate in a predetermined pattern with an inkjet method (2001). In this case, the adhesive may be applied on the pair of substrate electrode pads provided in the respective pixel areas on the mounting surface of the substrate. The adhesive may include a conductive filler.

Based on the pair of electrode terminals of the light-emitting device being formed on the top surface (e.g., light-emitting surface) of the light-emitting device, the pair of electrode terminals may be electrically connected through a separate wiring from the pair of substrate electrode pads corresponding thereto. In this case, because it may be sufficient for the adhesive to physically attach the light-emitting device to the mounting surface of the substrate without an electrical connection, the adhesive may be comprised of a non-conductive material.

Further, the substrate 20 may be disposed in the guide apparatus 100 (2001). For example, the substrate 20 may be seated on the top surface 111 of the base 110. The substrate 20 may be stably disposed on the base 110 by the multiple fixing members 120 (referring to FIG. 9).

After seating the substrate 20 on the base 110, the guide member 130 may be arranged on the mounting surface 21 of the substrate 20. In this case, multiple guide holes 133' provided on the guide member 130' may correspond to the respective pixel areas 50 (referring to FIG. 3) provided in the mounting surface 21 of the substrate 20.

The guide member 130 may be disposed on the base 110 to cover the mounting surface 21 of the substrate 20. In this state, multiple clamping members 150 may be used to fix the guide member 130 to the base 110 so that the substrate 20 is prevented from being separated from the guide apparatus 100 when performing the fluidic self-assembly.

Prior to fixing the substrate 20 to the guide apparatus 100, the hydrophilic surface processing may be performed on the substrate 20 and the respective light-emitting devices 140, respectively. For example, the hydrophilic surface processing may be performed along column at which one substrate electrode pad (e.g., anode substrate electrode pad) of the pair of substrate electrode pads (anode substrate electrode pad and cathode substrate electrode pad) disposed at respective pixel areas of the substrate 20 is positioned. In addition, the hydrophilic surface processing may be performed on the one electrode terminal of the pair of electrode terminals (anode electrode terminal and cathode electrode terminal) of respective light-emitting devices 140. In this case, the electrode terminal for performing hydrophilic processing may be the same anode electrode terminal as with the hydrophilic processed substrate electrode pad of the substrate 20. The hydrophilic surface processing for modifying the substrate 20 and the respective light-emitting devices 140 to hydrophilic may be applied with, for example, a chemical processing method, an ultraviolet irradiation method, an oxygen plasma processing method, or the like.

The guide apparatus 100 may be placed in the tank 180 (referring to FIG. 3) loaded with a liquid 181 (referring to FIG. 13) (2003), and multiple light-emitting devices 140' may be introduced into the liquid 181 in the tank 180 (2004).

Further, the multiple light-emitting devices may be arranged on the mounting surface 21 of the substrate 20 through the fluidic self-assembly (2005).

For example, when the liquid 181 in the tank 180 is circulated, the multiple light-emitting devices 140' floating in the liquid 181 may flow in the tank 180 and may be inserted into the respective guide holes 133' of the guide member 130' as in FIG. 21.

In the above, the fluidic self-assembly has been performed by loading the guide apparatus 100 mounted with the substrate 20 in the liquid 181 in the tank 180, but the embodiment is not limited thereto. For example, the hydrophilic surface processing may be performed along column at which one substrate electrode pad (e.g., anode substrate electrode pad) of a pair of substrate electrode pads (anode substrate electrode pad and cathode substrate electrode pad) disposed at respective pixel areas of the substrate 20 is positioned. In addition, the hydrophilic surface processing may be performed on one electrode terminal of the pair of electrode terminals (the anode electrode terminal and the cathode electrode terminal) of the respective light-emitting devices 140. In this case, the electrode terminal performing hydrophilic processing may be the same anode electrode terminal as with the hydrophilic processed substrate electrode pad of the substrate 20.

After performing the hydrophilic surface processing, a predetermined amount of water may be sprayed on the top surface of the guide member 130'. In this state, a predetermined bar, which is spaced apart at a predetermined distance from the top surface of the guide member 130' while the multiple light-emitting devices 140' are scattered on the top surface of the guide member 130', may be repeatedly moved in one direction or a direction opposite thereto. The multiple light-emitting devices 140' may be inserted into the guide hole 133' while in movement by being pushed by the bar.

Based on the multiple light-emitting devices 140' being inserted into all of the multiple guide holes 133' through the fluidic self-assembly, the top surface of the multiple light-emitting devices 140' may be pressed with the pressing member and the pre-bonding of attaching the mounting surface 21 of the substrate 20 with the adhesive may be carried out (2006).

Referring to FIG. 21, the thickness T3 of the guide member 130' may be thinner than the thickness T4 of the multiple light-emitting devices 140'. Accordingly, the multiple light-emitting devices 140' may be pressed by the pressing member without interference by the guide member 130'. Even when heat is not applied at the pre-bonding, the light-emitting device may be stably attached to the mounting surface 21 of the substrate by the adhesive.

The light-emitting device 140' may not be provided with the post 141 unlike the light-emitting device 140 described above.

After pre-bonding, the guide member 130' may be removed with a chemical method (2007). For example, based on producing the guide member 130' with a resin, the guide member 130' may be removed by using a resin remover. As described above, the guide member 130' may be for a one-time use.

Further, the multiple light-emitting devices 140' may be firmly bonded to the mounting surface 21 of the substrate 20 through the main bonding (2008).

The main bonding may be formed through a thermocompression process different from the pre-bonding. In this case, the pair of electrode terminals of the light-emitting device 140 may be, for example, eutectic bonded to the pair of substrate electrode pads arranged on the mounting surface 21 of the substrate 20 corresponding thereto.

Meanwhile, although not illustrated in the drawings, when the pair of electrode terminals of the light-emitting device are disposed on the top surface (light-emitting surface), the main bonding process may be omitted. In this case, an additional process of the pair of electrode terminals of the light-emitting device being electrically and physically connected to the pair of substrate electrode pads of the substrate 20, respectively, by a separate wiring may be added.

While the disclosure has been illustrated and described with reference to various example embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A guide apparatus configured to transfer light-emitting devices in a liquid onto a substrate, the guide apparatus comprising:
- a base configured to support the substrate;
- a guide member configured to couple with the base to be seated on a mounting surface of the substrate in a state in which the substrate is supported on a surface of the base, wherein the guide member comprises a skirt part configured to contact a top surface of the base; and
- a clamping member configured to engage the skirt part to couple the guide member to the base,
- wherein the guide member comprises guide holes configured to respectively guide the light-emitting devices in the liquid to be disposed on the mounting surface of the substrate, and
- wherein the guide member is coupled to the base to form the guide apparatus, and the guide apparatus is configured to hold the substrate prior to the substrate and the guide apparatus being immersed in a dispersion of the light-emitting devices in a tank containing the liquid.

2. The guide apparatus of claim 1, wherein a number of the guide holes has a first size, and a remaining number of the guide holes has a second size that is different from the first size.

3. The guide apparatus of claim 1, wherein each of the guide holes has a same size.

4. The guide apparatus of claim 1, wherein first guide holes of the guide holes provided in a first area of the guide member have a first size, and
- wherein second guide holes of the guide holes provided in a second area of the guide member have a second size that is different from the first size.

5. The guide apparatus of claim 1, wherein each of the guide holes have a same shape.

6. The guide apparatus of claim 1, wherein first guide holes of the guide holes provided in a first area of the guide member have a first shape, and
- wherein second guide holes of the guide holes provided in a second area of the guide member have a second shape that is different from the first shape.

7. The guide apparatus of claim 1, wherein the guide member comprises a first substrate insertion groove configured to receive a first substrate and a second substrate insertion groove configured to receive a second substrate, and
- wherein the first substrate insertion groove and the second substrate insertion groove are provided on an inside surface of the guide member.

8. The guide apparatus of claim 1, wherein a thickness of the guide member is less than or equal to a thickness of each of the light-emitting devices.

9. The guide apparatus of claim 1, wherein the guide member comprises a material which is removable by dissolution in a solvent.

10. The guide apparatus of claim 1, wherein the base comprises fixing members configured to fix the substrate to the base.

11. The guide apparatus of claim 10, wherein the fixing members are configured to support respective corners of the substrate and are provided at positions corresponding to the respective corners of the substrate.

12. The guide apparatus of claim 10,
- wherein the guide member comprises grooves, and
- wherein the fixing members are configured to engage the grooves to align the guide member with the substrate.

13. The guide apparatus of claim 1,
- wherein the guide apparatus is configured to transfer the light-emitting devices onto the mounting surface of the substrate, and
- wherein the mounting surface is a planar surface.

* * * * *